(12) United States Patent  
Djordjevic et al.

(10) Patent No.: US 9,071,383 B2  
(45) Date of Patent: *Jun. 30, 2015

(54) MODIFIED ORTHOGONAL POLYNOMIALS BASED HYBRID CODED-MODULATION FOR MULTI-TB/SECOND OPTICAL TRANSPORT

(71) Applicant: NEC Laboratories America, Inc., Princeton, NJ (US)

(72) Inventors: Ivan B Djordjevic, Tuscon, AZ (US); Ting Wang, West Windsor, NJ (US)

(73) Assignee: NEC Laboratories America, Inc., Princeton, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 14/172,468

(22) Filed: Feb. 4, 2014

(65) Prior Publication Data

US 2014/0219653 A1 Aug. 7, 2014

Related U.S. Application Data

(60) Provisional application No. 61/760,369, filed on Feb. 4, 2013.

(51) Int. Cl.
*H04B 10/04* (2006.01)
*H04J 14/06* (2006.01)

(52) U.S. Cl.
CPC .................................. *H04J 14/06* (2013.01)

(58) Field of Classification Search
CPC ............. H04B 10/516; H04B 10/5161; H04B 10/532; H04B 10/548; H04B 10/614; H04J 14/04; H04J 14/06
USPC ......... 398/79, 76, 44, 152, 65, 184, 183, 188, 398/135, 136, 193, 194, 158, 159, 202, 205, 398/208

See application file for complete search history.

(56) References Cited

U.S. PATENT DOCUMENTS

2009/0052907 A1* 2/2009 Batshon et al. ............... 398/182
2009/0297144 A1* 12/2009 Djordevic et al. ............. 398/39
2014/0270759 A1* 9/2014 Djordjevic et al. ............ 398/44

* cited by examiner

*Primary Examiner* — Hanh Phan
(74) *Attorney, Agent, or Firm* — Joseph Kolodka

(57) ABSTRACT

A system and method for transmitting data, including one or more Low Density Parity Check (LDPC) encoders configured to encode one or more streams of input data; a signal constellation generation module configured to generate one or more signal constellations; one or more modulators configured to generate one or more signals using hybrid multidimensional coded modulation; a modified orthogonal polynomial generation module configured to generate modified orthogonal polynomials for use as electrical basis functions; and one or more mode-multiplexers and transmitters configured to mode-multiplex and transmit one or more LDPC-coded data streams over a transmission medium.

20 Claims, 8 Drawing Sheets

US 9,071,383 B2

MODIFIED ORTHOGONAL POLYNOMIALS BASED HYBRID CODED-MODULATION FOR MULTI-TB/SECOND OPTICAL TRANSPORT

RELATED APPLICATION INFORMATION

This application claims priority to provisional application Ser. No. 61/760,369 filed on Feb. 4, 2013, incorporated herein by reference.

BACKGROUND

1. Technical Field

The present invention relates to coded modulation, and in particular, to systems and methods for hybrid-coded modulation employing modified orthogonal polynomials as basis functions.

2. Description of the Related Art

As tile response to never ending demands for higher data rates and distance independent connectivity, 100 Gb/s Ethernet (GbE) standard has been already adopted, and 400 GbE and 1 TbE have become the research focus of many researchers. IEEE recently ratified the 40/100 GbE standard IEEE 802.3ba. As the operating symbol rates increase, the deteriorating effects of fiber nonlinearities and polarization-mode dispersion (PMD) reach levels that inhibit reliable communication over the optical fiber network.

High speed (e.g., Terabit) optical Ethernet technologies may be affected by the limited bandwidth of information-infrastructure, high energy consumption, and heterogeneity of optical networking infrastructure, for example. Furthermore, in the context of high-speed optical communication systems, not only the error correction performance but also the complexity of a coded modulation system plays a crucial role. To reach beyond 1 Tb/s serial date rates, extremely large signal constellation sizes are currently required for polarization-division multiplexed (PDM) single-carrier QAM systems, with commercially available symbol rates.

SUMMARY

A method for transmitting data, comprising encoding one or more streams of input data using one or more Low Density Parity Check (LDPC) encoders; generating one or more signal constellations; modulating one or more signals using hybrid multidimensional coded modulation; applying modified orthogonal polynomials as electrical basis functions and spatial modes as optical basis functions; and mode-multiplexing and transmitting one or more LDPC-coded data streams over a transmission medium.

A system for transmitting data, comprising one or more Low Density Parity Check (LDPC) encoders configured to encode one or more streams of input data; a signal constellation generation module configured to generate one or more signal constellations; one or more modulators configured to generate one or more signals using hybrid multidimensional coded modulation; a modified orthogonal polynomial generation module configured to generate modified orthogonal polynomials for use as electrical basis functions; and one or more mode-multiplexers and transmitters configured to mode-multiplex and transmit one or more LDPC-coded data streams over a transmission medium.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
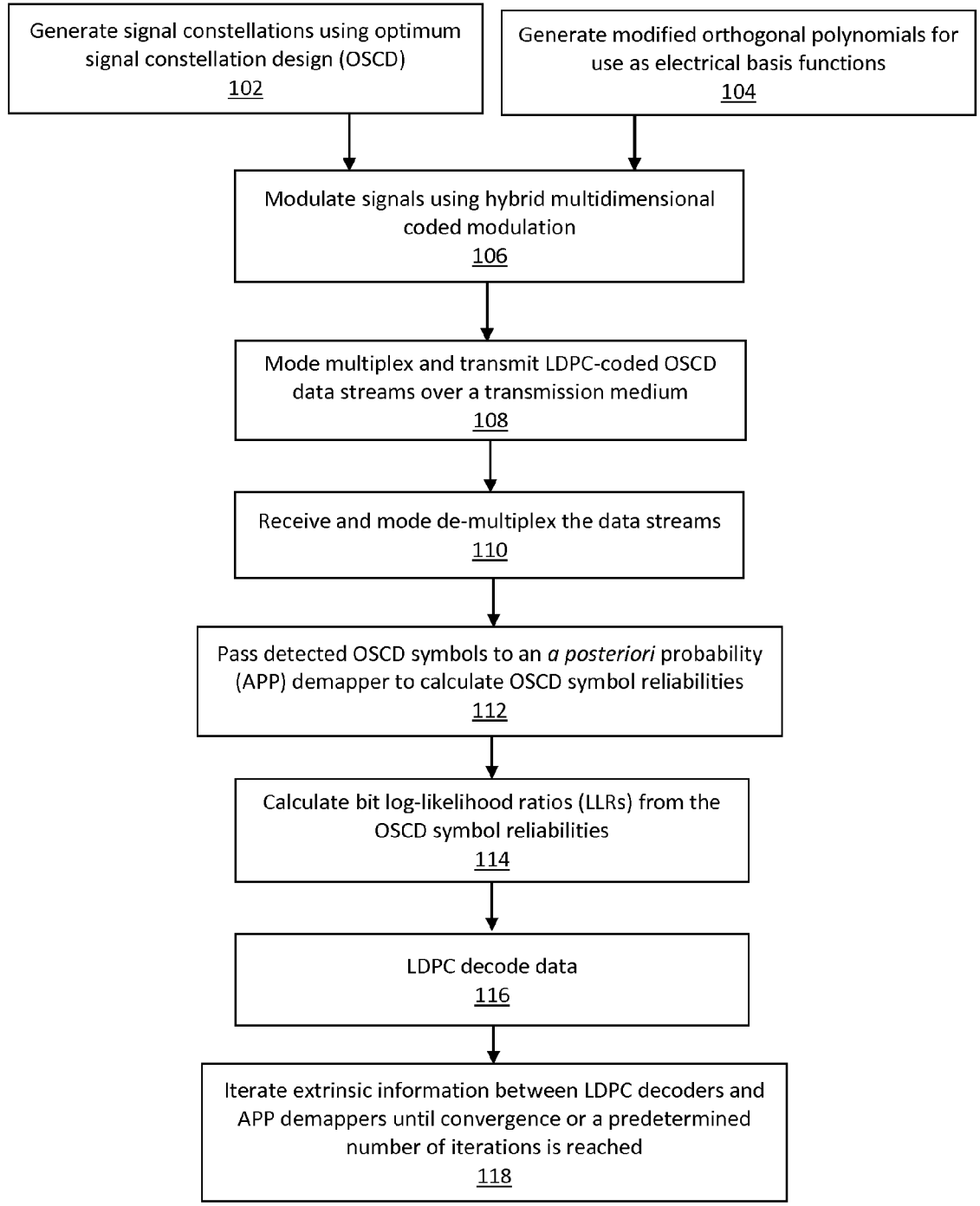
FIG. 1 shows a block/flow diagram illustrating an optical data transport system/method including modified orthogonal polynomial based hybrid coded modulation according to the present principles.

To solve problems associated with ultra-high speed (e.g., Terabit) optical Ethernet technologies (e.g., limited bandwidth of information infrastructure, high energy consumption, heterogeneity of optical networking infrastructure, etc.), hybrid multidimensional coded-modulation, employing both electrical and optical degrees of freedom may be employed according to the present principles. The optical degrees of freedom may include the polarization and spatial modes in few-mode fibers. In one embodiment, modified orthogonal polynomials may be employed as the electrical basis functions according to the present principles.

For example, modified Hermite polynomials may be employed, and in addition to orthogonality, these may include another feature for multidimensional signaling. Namely, both the pulse duration and pulse bandwidth do not change significantly when the order of a polynomial is increased. By using M modified orthogonal polynomials as basis functions in both in-phase and quadrature channels, in combination with two orthogonal polarization states and N orthogonal spatial modes according to the present principles, multi-Tb/s serial optical transport over ultra-long distances (e.g., several thousand km) may be achieved by using single-carrier only and commercially available electronics. In one embodiment, rather than employing 2M real modified orthogonal polynomials or M complex modified orthogonal polynomials, 2M-dimensional modified orthogonal polynomials may be used The employment of multidimensional signaling brings several important advantages compared to prior polarization-division multiplexed (PDM) quadrature amplitude modulation (QAM) schemes. For example, the Euclidean distance among signal constellation points for the same symbol energy may be increased as compared to 2-D constellations and the nonlinear PDM effects in single-mode-fiber (SMF) applications and nonlinear interaction among spatial modes in few-mode-fiber (FMF) applications may be compensated by LDPC-coded turbo equalization.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Referring now in detail to the figures in which like numerals represent the same or similar elements and initially to FIG. 1, an optical data transport system/method including modified orthogonal polynomial based hybrid coded modulation is illustratively depicted according to the present principles. In one embodiment, signal constellations are generated using optimum signal constellation design (OSCD) in block 102. OSCD may be employed for ultra-high speed serial transmission (e.g., beyond 400 Gb/s) using a polarization division multiplexed (PDM) coded-modulation scheme based on signal constellations obtained by minimization of the mean-square error (MSE) of signal constellations representing the source for the optimum source distribution. In one embodiment, the optimum source distribution may be obtained by maximizing the channel capacity, based on the Arimoto-Blahut algorithm for a given finite-input finite-output channel. The Arimoto-Blahut algorithm may be employed to iterate probability mass functions to achieve convergence and optimum source distribution. Therefore, these signal constellations are optimum in the minimum MSE (MMSE) sense, and the method formulated in accordance with the present principles is thus named the MMSE-optimum signal constellation design (OSCD) method.

The OSCD-based constellations may be channel capacity achieving signal constellations, and may be combined with Low Density Parity Check (LDPC) codes of high girth (e.g., girth-8, girth-10, etc.). The constellations obtained by Cartesian products of existing 1-D and 2-D constellations can be used as well. Additionally, the constellations obtained by sphere-packing method can also be used in combination with a hybrid coded-modulation scheme in accordance with the present principles. In one embodiment, signal constellation sizes that are not a power of two are employed to improve the tolerance to either in-phase/quadrature (I/Q) imbalance or polarization crosstalk due to imperfectly compensated PMD. The signal constellation may be decomposed into two sub-constellations corresponding to in-phase and quadrature channels. As sub-constellations may belong to the same parent constellation in the presence of I/Q imbalance, the corresponding points do not overlap. For example, in a 96-ary constellation, 64 points may be allocated to the in-phase channel, and the remaining 32 points may be allocated to the quadrature channel (or vice versa).

The signals may then be modulated using hybrid multidimensional coded modulation in block 106, and both electrical and optical degrees of freedom may be employed. The optical degrees of freedom may include the polarization and spatial modes in FMFs. Modified orthogonal polynomials may be generated and employed as electrical basis functions in block 104, which are provided as input to hybrid multidimensional coded modulation in block 106. In one embodiment, the modified orthogonal polynomial based single-carrier hybrid coded-modulation according to the present principles may enable multi-Tb/s technology while employing commercially available electronics, and may simultaneously solve the limited bandwidth and high energy consumption problems of information infrastructure. In another embodiment, by employing M modified orthogonal polynomials as basis functions in both in-phase and quadrature channels, in combination with two orthogonal polarization states and N orthogonal spatial modes, multi-Tb/s serial optical transport over several thousand km may be achieved while employing single-carrier only and commercially available electronics.

One or more independent LDPC-coded OSCD data streams may be mode-multiplexed and transmitted over a transmission medium (e.g., FMF, FCF, etc.) in block 108. The data streams may be received and mode de-multiplexed in block 110, which may be followed by coherent detection by employing, for example, polarization diversity receivers. After compensation of optical channel impairments, detected OSCD symbols may be passed to an a posteriori probability (APP) demapper, and OSCD reliabilities may be calculated in block 112. Bit log-likelihood ratios (LLRs) may be calculated from the OSCD symbol reliabilities in block 114, and LDPC decoding may be performed by one or more LDPD decoders in block 116. Extrinsic information may be iterated between LDPC decoders and APP demappers until either convergence or until a pre-determined number of iterations has been reached in block 118.

In one embodiment, the modified orthogonal polynomials may been used as electrical basis functions, while polarization and spatial modes may be used as optical basis functions. The single-carrier hybrid coded-modulation scheme according to the present principles represents a multi-Tb/s enabling technology, while employing much lower 25 GS/s symbol rates. It is noted that the above modified orthogonal polynomial based hybrid coded modulation data transport method is flexible, and may be employed in a plurality of different configurations ranging from, for example, the multiplexing of 2N 2M-dimensional signals to fully 4MN-dimensional splitting. While the above method of data transport has been illustratively depicted as employing OSCD, an optical transmission medium, and particular types of dimensional splitting it is noted that other sorts of constellation designs, transmission media, and dimensional splitting may also be employed according to the present principles.

Figure 2:
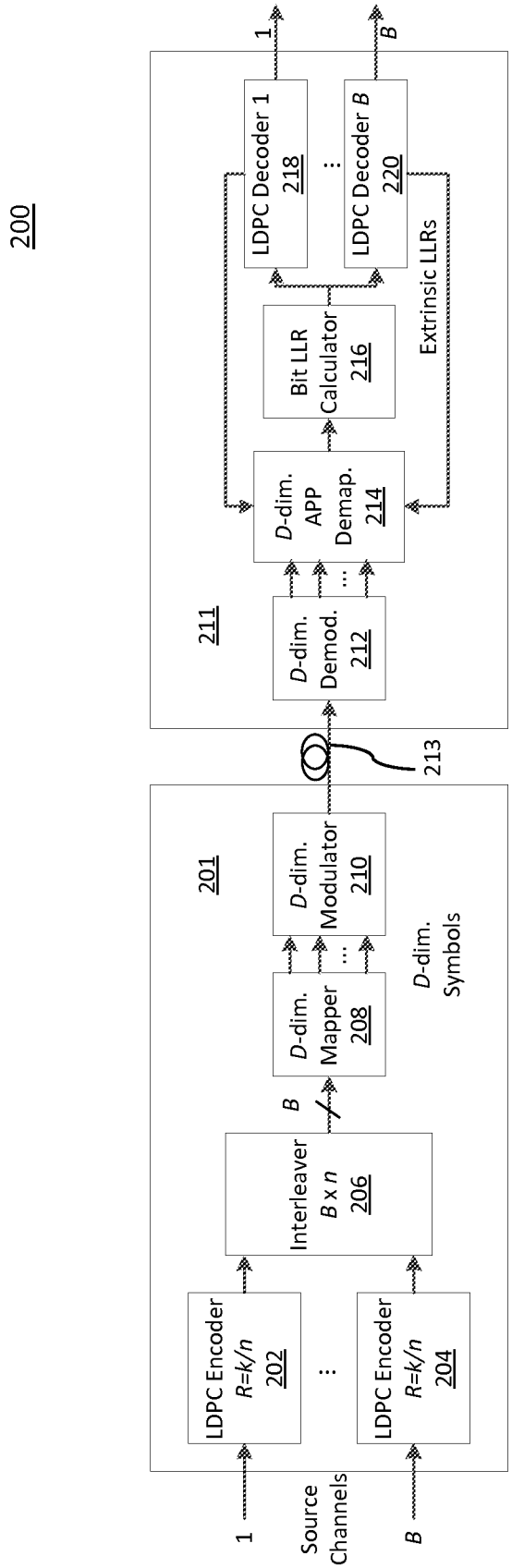
FIG. 2 shows a block/flow diagram illustrating a system/method for data transport using hybrid D-dimensional modulators and demodulators according to the present principles.

Referring now to FIG. 2, a system/method for hybrid discrete-time (DT) D-dimensional coded modulation using hybrid D-dimensional modulators and demodulators 200 is illustratively depicted according to the present principles. One or more D-dimensional modulators 210 may be employed, and may generate signal constellation points as follows:

$$s_i = C_D \sum_{d=1}^{D} \phi_{i,d} \Phi_d,$$

where $\phi_{i,d}$ denotes the dth coordinate (d=1,2, . . . , D) of the ith signal-constellation point, and the set $\{\phi_1, \ldots, \phi_D\}$ denotes the set of basic functions: M modified orthogonal polynomials corresponding to in-phase channel, M orthogonal polynomials corresponding to quadrature channel, two polarization states, and N spatial modes. Therefore, the corresponding signal space may be 4MN-dimensional. Alternatively, a set of M complex orthogonal polynomials can be used instead of a set of 2M real orthogonal polynomials according to the present principles. Additionally, multidimensional modified orthogonal polynomials are applicable as well.

It is noted that the pulse duration and bandwidths of modified Hermite polynomials do not change much with polynomial order, and as such they are suitable to generate the set of 2M-orthogonal basis functions. The modified Hermite polynomials may be defined as:

$$\Phi_m(t) = k_m (-\tau)^n e^{-t^2/4\tau^2} \tau^2 \frac{d^m}{dt^m}(e^{-t^2/2\tau^2}),$$

m=0,1, . . . , 2M−1, where $k_m$ is related to pulse energy $E_m$ by $k_m = \sqrt{E_m/(\tau n! \sqrt{2\pi})}$ (The parameter τ needs to be properly selected (e.g., based on bandwidth)). Other properly modified orthogonal polynomials may also be used in accordance with the present principles. In addition, prolate spheroidal wave functions and wavelet packets may also be applicable according to the present principles. The discrete-time electrical basis functions are obtained by proper sampling of continuous-wave basis functions $\Phi_m(t)$, namely $\Phi_m(nT)=\Phi_m(t)|_{t=nT}$, where T is the sampling interval related to symbol duration Ts as follows: T=Ts/U, where U is up-sampling factor.

In one embodiment, a transmitter 201 and a receiver 211 including hybrid D-dimensional modulators 210 and demodulators 212 are illustratively depicted according to the present principles. The B binary data streams may be encoded using B (n,k) LDPC codes in blocks 202 and 204. The codewords generated by LDPC encoders may be written in row-wise fashion into one or more corresponding block-interleavers 206. The B bits at time instance i may be taken from the block-interleaver in column-wise fashion and used as the input of corresponding D-dimensional mapper 208, and may be implemented as a look-up table (LUT). The D-coordinates from the mapper 208 may be used as input to the D-dimensional modulator 210. In one embodiment, the B binary LDPC encoders and interleaver may be replaced by a single nonbinary LDPC encoder.

The D-dimensional signal constellation points, which may be transmitted over a transmission medium 213 (e.g., FMF) in a communication system of interest, may be reconstructed using a D-dimensional demodulator 212, and may provide estimates of projections along the basis functions. It is noted that SMF-based systems are considered as a special case of FMF-based systems with only one spatial (e.g., fundamental) mode. The reconstructed coordinates may be employed as input to one or more D-dimensional a posteriori probability (APP) demappers 214, which may calculate symbol log-likelihood ratios (LLRs).

The bit log likelihood ratios used for LDPC decoding may be calculated in block 216. After LDPC decoding in blocks 218 and 220, the extrinsic information may be passed back to the APP demapper 214, and the extrinsic information may be iterated between the LDPC decoders 218, 220 and the APP demapper 214 until convergence, or until pre-determined number of iterations has been reached. In another embodiment, the bit LLR calculator and binary LDPC decoders can be replaced by a single nonbinary LDPC decoder. It is noted that although two LDPC encoders and decoders are illustratively shown, any number of LDPC encoders and decoders may be employed according to the present principles.

Figure 3A:
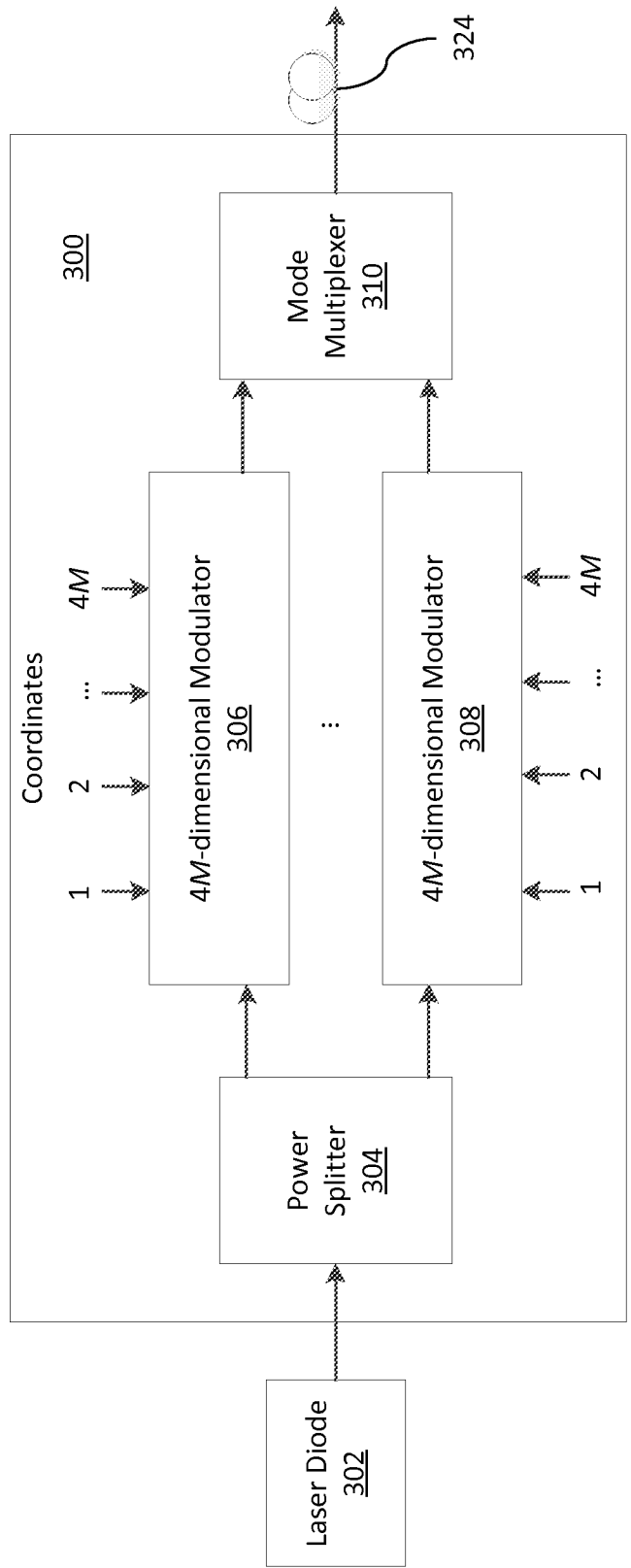
FIG. 3A shows a block/flow diagram illustrating a system/method for data transport including 4MN-dimensional modulators according to the present principles.

Referring now to FIG. 3A, a system/method for data transport including 4MN-dimensional modulators 300 is illustratively depicted according to the present principles. In one embodiment, a laser diode 302 is employed, and the 4MN-dimensional modulator 300 may include one 1:N power splitter, N 4M-dimensional modulators 306, 308 (e.g., E/O modulators), which receive coordinates (e.g., 1, 2, . . . , 4M) from the signal constellation. The signal may be mode-multiplexed by a N:1 mode-multiplexer 310, and the signal may be transmitted over a transmission medium 324 (e.g., FMF). It is noted that although two 4M-dimensional modulators are illustratively shown, any number of 4M-dimensional modulators may be employed according to the present principles.

Figure 3B:
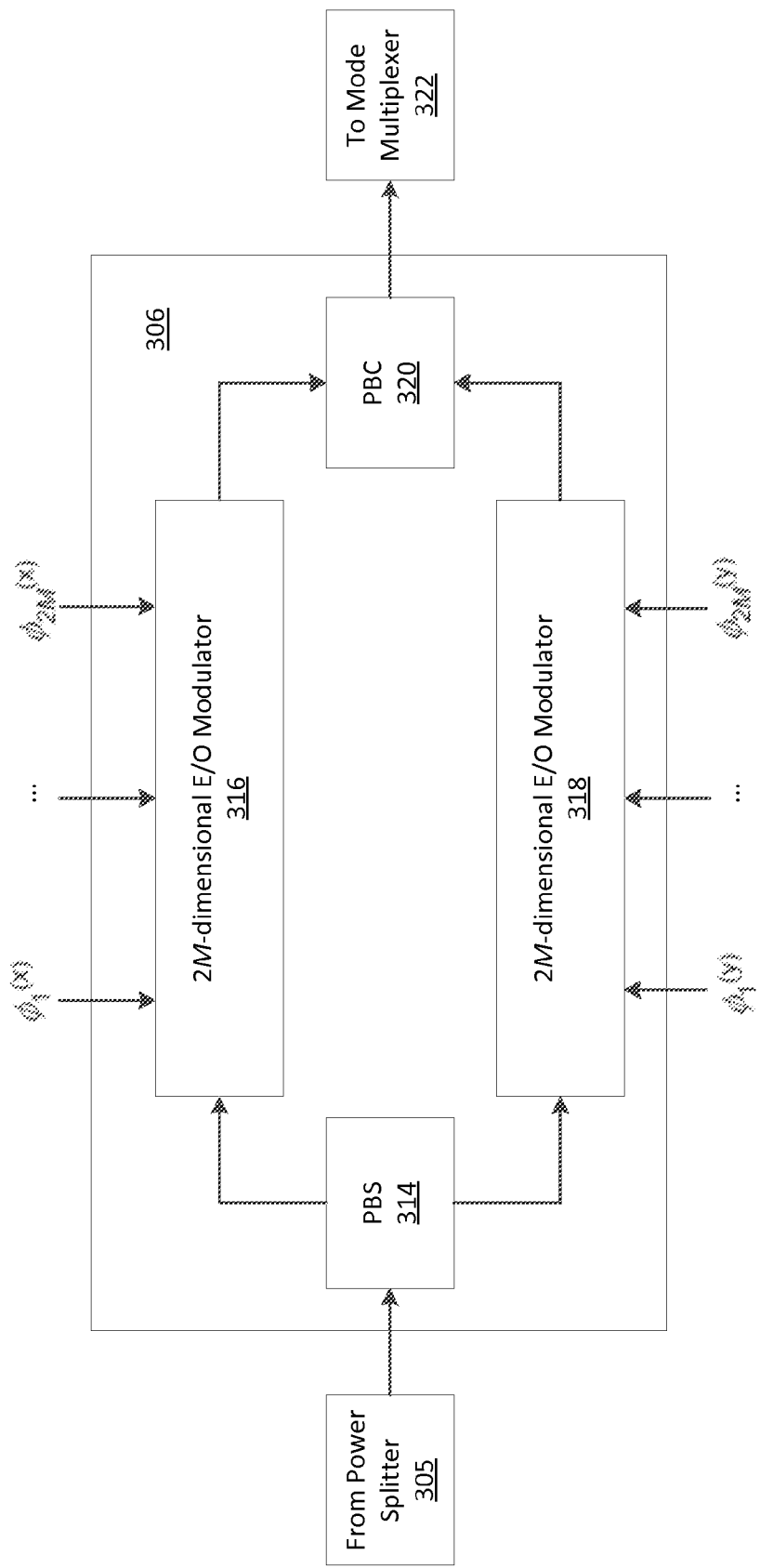
FIG. 3B shows a block/flow diagram illustrating a detailed representation of a 4M-dimensional modulator according to the present principles.

Referring now to FIG. 3B, a system/method including a detailed representation of a 4M-dimensional modulator 306 is illustratively depicted according to the present principles. In one embodiment, the 4M-dimensional modulator 306 may receive input from a power splitter 305, and may employ one polarization beam splitter (PBS) 314, two 2M-dimensional modulators 316, 318, and one polarization beam combiner (PBC) 320. The data may then be passed to one or more mode multiplexers 322 in accordance with the present principles. It is noted that although two 2M-dimensional modulators are illustratively shown, any number of 2M-dimensional modulators may be employed according to the present principles.

Figure 4:
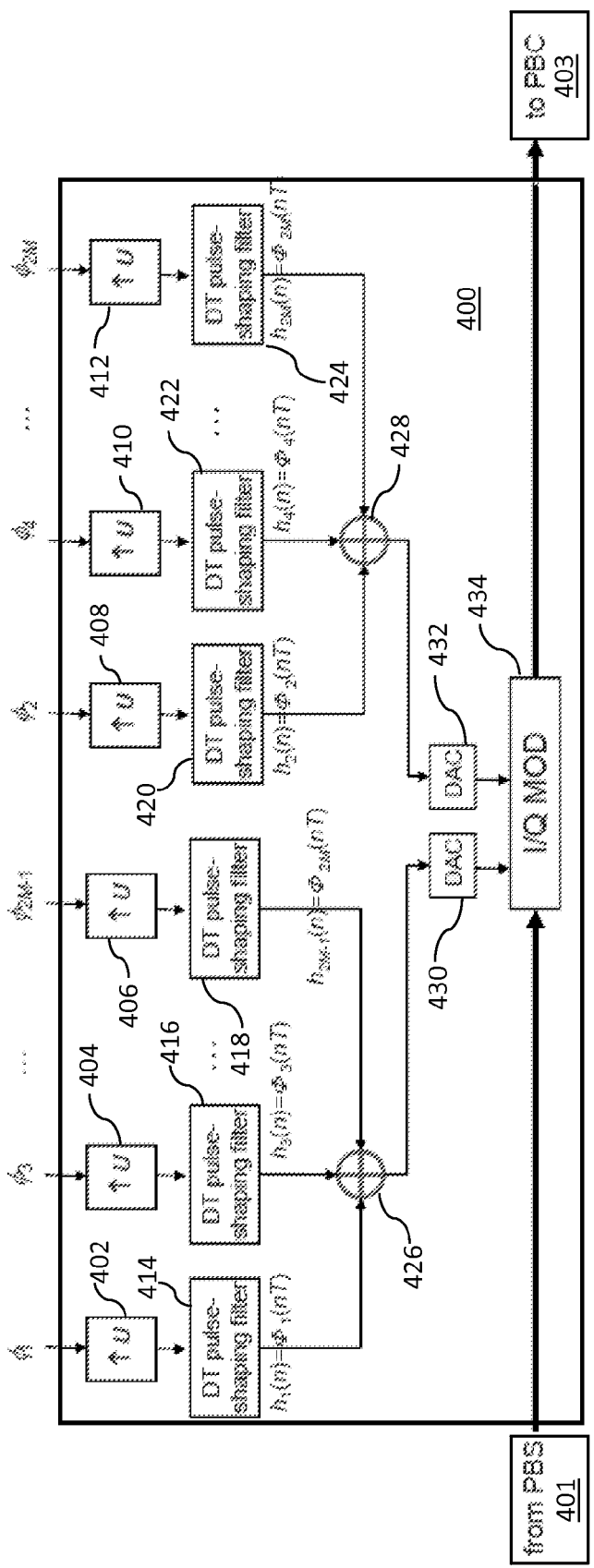
FIG. 4 shows a block/flow diagram illustrating a system/method for data transport including a 2M-dimensional modulator according to the present principles.

Referring now to FIG. 4, a system/method for data transport including a 2M-dimensional modulator 400 is illustratively depicted according to the present principles. In one embodiment, the laser signal may be received from a PBS 401, may be modulated using an I/Q modulator 434, and the modulated data may be passed to a PBC 403. The even/odd coordinates of a 2M-dimensional signal constellation may be up-sampled in blocks 402, 404, 406, 408, 410, and 412, and after up-sampling may be passed through corresponding DT pulse-shaping filters 141, 416, 418, 420, 422, 424 of impulse responses $h_m(n)=\Phi_m(nT)$, whose outputs may be combined together into a single real data stream representing the in-phase/quadrature signal in blocks 426 and 428. After digital-to-analog conversion (DAC) in blocks 430 and 432, the corresponding in-phase and quadrature signals may be employed as inputs to the I/Q modulator 434, and the data may be passed to a PBC in block 403. It is noted that although six up-samplers and DT pulse-shaping filters are illustratively shown, any number of up-samplers and DT pulse-shaping filters may be employed according to the present principles.

Figure 5:
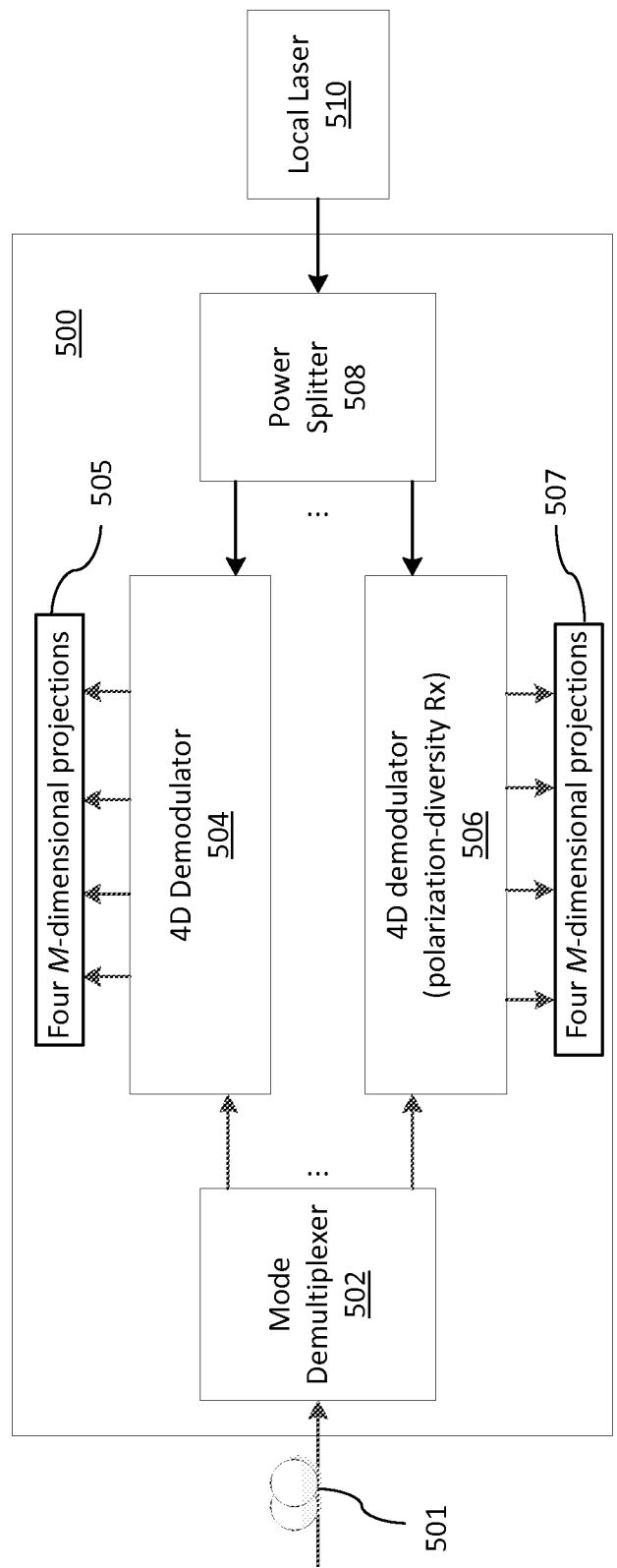
FIG. 5 shows a block/flow diagram illustrating a system/method for data transport including 4MN-dimensional demodulators according to the present principles.

Referring now to FIG. 5, a system/method for data transport including 4MN-dimensional demodulators 500 is illustratively depicted according to the present principles. In one embodiment, a data may be received from a transmission medium 501 (e.g., FMF), and may be mode-demultiplexed by a mode-demultiplexer in block 502. After mode-demultiplexing in block 502, mode projections may be forwarded to the 4D-demodulator 504 and a conventional polarization diversity receiver 506, which may provide the projections along electrical basis functions in both polarizations in blocks 505 and 507. Each projection may represent one or more estimates of M-dimensional electrical signals.

The M-dimensional projections may be, after analog-to-digital conversion (ADC), employed as inputs of corresponding matched filters of impulse responses $h_m(n)=\Phi_m(-nT)$. In one embodiment, the outputs after re-sampling may represent projections along the corresponding basis functions, and these projections may be employed as inputs to a D-dimensional APP demapper (not shown). A local laser signal 510 may be employed as input to 4D demodulators 504 and 506 for coherent detection after power splitting in block 508. It is noted that although two 4D demodulators are illustratively shown, any number of 4D demodulators may be employed according to the present principles.

It is noted that the system/method according to the present principles is flexible, and can be used in various configurations ranging from multiplexing of 2N 2M-dimensional signals to fully 4MN-dimensional signaling. The spectral efficiency of system/method according to the present principles may be $$S_E / S_E^{PDMQAM} = \frac{\log_2(2^{4MN})R_s}{2\log_2(M_{QAM})R_s} = 4MN/\log_2(M_{QAM})$$

times better than that of PDM-QAM for the same symbol rate $R_S$, where $M_{QAM}$ denotes QAM signal-constellation size. For example, the 1 Tb/s may advantageously be achieved by using the commercially available electronics operating at 12.5 Giga symbols/s (GS/s) for M=4, N=5 according to the present principles, but previous single-carrier PDM-QAM systems operating at 12.5 GS/s would require enormous signal constellation size ($M_{QAM}=2^{40}$) to achieve 1 Tb/s, and that is not possible to implement in practice.

Figure 6:
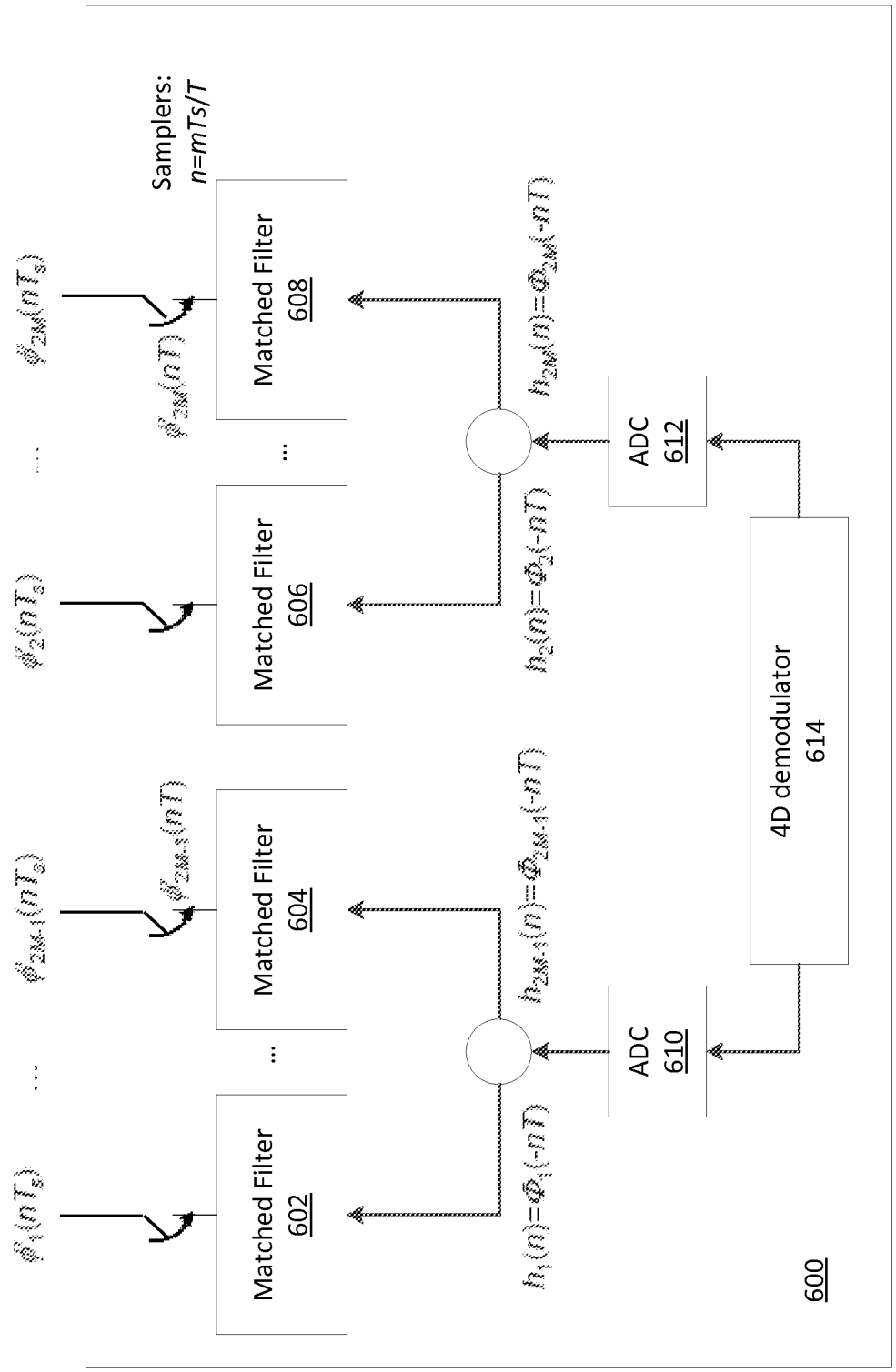
FIG. 6 shows a block/flow diagram illustrating a system/method for data transport including a 4D-demodulator according to the present principles.

Referring now to FIG. 6, a system/method for data transport including a 4D-demodulator 600 is illustratively depicted according to the present principles. In one embodiment, one or more signals may be demodulated by a 4D-demodulator 614, and two M-dimensional projections may be used as inputs for corresponding matched filters of impulse responses 602, 604, 606, 608 (e.g., $h_m(n)=\Phi_m(-nT)$; m=1, ..., 2M) after analog-to-digital conversion (ADC) in blocks 610 and 612. For complex basis functions, the impulse responses of corresponding matched filters in block 600 may be represented as $h_{mm}(n)=\Phi_m^*(-nT)$, m=1, ..., M.

Figure 7:
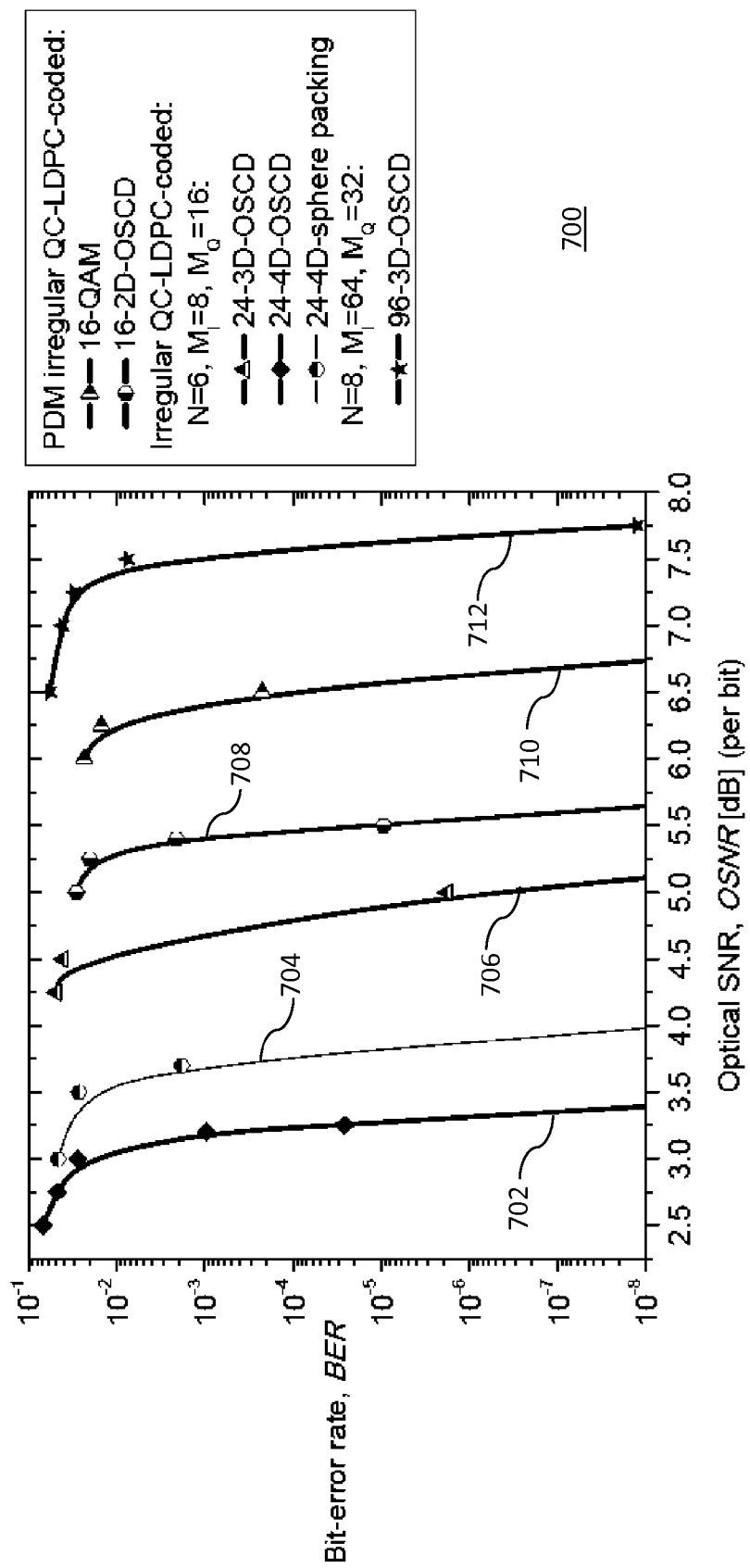
FIG. 7 shows plots of bit error rate (BER) versus signal to noise ratio (SNR) for performance of modified orthogonal polynomial based hybrid coded modulation according to the present principles.

Referring now to FIG. 7, plots of bit error rate (BER) versus optical signal to noise ratio (OSNR) (per bit) for performance of modified orthogonal polynomial based hybrid coded modulation 700 are illustratively depicted according to the present principles. In one embodiment, Monte Carlo simulations for an amplified spontaneous emission (ASE) noise dominated scenario, for information symbol rates of 25 GS/s, and for irregular quasi-cyclic (QC)-LDPC (28180,21135) of girth-8 and average column weight of 4 may be employed according to the present principles.

The results of the simulations are illustratively shown for 5 outer (APP demapper-LDPC decoders) iterations and 20 LDPC decoder iterations. The signal constellations may be obtained by optimum signal constellation design (OSCD). The PDM LDPC-coded 16-2D-OSCD 708 outperforms corresponding 16-QAM 710 by 1.1 dB at BER of $10^{-8}$. For two spatial modes, these schemes may be compatible with 400 GbE. Other schemes are suitable for beyond 1 Tb/s optical transport. To improve the tolerance to I/Q imbalance, the signal constellation sizes that are not power of two may be employed. The 24-ary (702, 704, 706) and 96-ary (712) constellations may be decomposed into two-sub constellations. The 16-points for 24-ary constellation are allocated to the in-phase channel and remaining 8 to quadrature channels. On the other hand, in 96-ary constellation 64 points are allocated to in-phase channel and remaining 32 points to quadrature channel.

Because sub-constellations belong to the same parent constellation in the presence of I/Q imbalance the corresponding points do not overlap. In one embodiment, 24-ary 4D-OSCD 702 outperforms the corresponding constellation obtained by sphere-packing method 704 (that is, optimum when number of dimensions tends to infinity) by 0.6 dB. The spectral efficiency of 24-ary constellations is 7 bits/s/Hz/polarization/spatial modes. On the other hand, the spectral efficiency of 96-ary constellation is 11 bits/s/Hz/polarization/spatial modes. The aggregate data rate of 24-ary constellations when N=8 spatial modes (and two polarizations) are used is 2.8 Tb/s, while that of 96-ary constellation is 4.4 Tb/s. Therefore, the system/method according to the present principles enables beyond 1 Tb/s optical transport.

Having described preferred embodiments of an optical data transport system/method including modified orthogonal polynomial based hybrid coded modulation, employing both electrical and optical degrees of freedom (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for transmitting data, comprising:
encoding one or more streams of input data using one or more Low Density Parity Check (LDPC) encoders;
generating one or more signal constellations;
modulating one or more signals using hybrid multidimensional coded modulation;
applying modified orthogonal polynomials as electrical basis functions and spatial Modes as optical basis functions; and
mode-multiplexing and transmitting one or more LDPC-coded data streams over a transmission medium.

2. The method as recited in claim 1, further comprising:
receiving and mode-demultiplexing the one or more data streams;
calculating optimum signal constellation design OSCD symbol reliabilities using one or more a posteriori probability (APP) demappers;
LDPC decoding data using one or more LDPC decoders; and
iterating extrinsic information between LDPC decoders and APP demappers until convergence or a predetermined number of iterations has been reached.

3. The method as recited in claim 1, wherein the hybrid multidimensional coded modulation employs both electrical and optical degrees of freedom.

4. The method as recited in claim 1, wherein the modified orthogonal polynomials are employed in both in-phase and quadrature channels in combination with two orthogonal polarization states and N orthogonal spatial modes.

5. The method as recited in claim 1, wherein the transmission medium is one or more of single-mode fiber (SMF), few-mode fiber (FMF), few-core fiber (FCF), and few-mode-few-core fiber (FMFCF).

6. The method as recited in claim 1, wherein the one or more signal constellations are decomposed into two sub-constellations, corresponding to in-phase and quadrature channels, for each of the one or more signal constellations.

7. The method as recited in claim 6, wherein corresponding points of each of the one or more signal sub-constellations do not overlap in constellation space.

8. The method as recited in claim 1, wherein the one or more signal constellations include one or more signal constellations with constellation sizes that are not a power of two to improve the tolerance to in-phase/quadrature (IQ) imbalance and the tolerance to polarization crosstalk from imperfectly compensated polarization-mode dispersion (PMD).

9. The method as recited in claim 1, wherein the one or more signal constellations are generated using optimum signal constellation design (OSCD).

10. The method as recited in claim 1, wherein the one or more signal constellations are generated using one of Cartesian products of existing 1-D and 2-D constellations or a sphere packing method.

11. A system for transmitting data, comprising:
one or more Low Density Parity Check (LDPC) encoders configured to encode one or more streams of input data;
a signal constellation generation module configured to generate one or more signal constellations;
one or more modulators configured to generate one or more signals using hybrid multidimensional coded modulation;
a modified orthogonal polynomial generation module configured to generate modified orthogonal polynomials for use as electrical basis functions; and
one or more mode-multiplexers and transmitters configured to mode-multiplex and transmit one or more LDPC-coded data streams over a transmission medium.

12. The system as recited in claim 11, further comprising:
one or more receivers and mode-demultiplexers configured to receive and mode-demultiplex the one or more data streams;
one or more a posteriori probability (APP) demappers configured to calculate OSCD symbol reliabilities;
one or more LDPC decoders configured to LDPC decode data; and
a feedback loop configured to iterate extrinsic information between LDPC decoders and APP demappers until convergence or a predetermined number of iterations has been reached.

13. The system as recited in claim 11, wherein the hybrid multidimensional coded modulation employs both electrical and optical degrees of freedom.

14. The system as recited in claim 11, wherein the modified orthogonal polynomials are employed in both in-phase and quadrature channels in combination with two orthogonal polarization states and N orthogonal spatial modes.

15. The system as recited in claim 11, wherein the transmission medium is one or more of single-mode fiber (SMF), few-mode fiber (FMF), few-core fiber (FCF), and few-mode-few-core fiber (FMFCF).

16. The system as recited in claim 11, wherein the one or more signal constellations are decomposed into two sub-constellations, corresponding to in-phase and quadrature channels, for each of the one or more signal constellations.

17. The system as recited in claim 16, wherein corresponding points of each of the one or more signal sub-constellations do not overlap.

18. The system as recited in claim 11, wherein the one or more signal constellations employed include one or more signal constellations with constellation sizes that are not a power of two to improve the tolerance to in-phase/quadrature (IQ) imbalance and the tolerance to polarization crosstalk from imperfectly compensated polarization-mode dispersion (PMD).

19. The system as recited in claim 11, wherein the one or more signal constellations are generated using optimum signal constellation design (OSCD).

20. The system as recited in claim 11, wherein the one or more signal constellations are generated using one of Cartesian products of existing 1-D and 2-D constellations and a sphere packing method.

* * * * *